United States Patent [19]

Krisch et al.

[11] 4,044,255
[45] Aug. 23, 1977

[54] CORPUSCULAR-BEAM TRANSMISSION-TYPE MICROSCOPE INCLUDING AN IMPROVED BEAM DEFLECTION SYSTEM

[75] Inventors: Burkhard Krisch; Moriz V. Rauch, both of Berlin, Germany

[73] Assignee: Siemens Aktiengesellschaft, Munich, Germany

[21] Appl. No.: 715,848

[22] Filed: Aug. 19, 1976

[30] Foreign Application Priority Data

Aug. 28, 1975   Germany .............................. 2538521

[51] Int. Cl.$^2$ ........................................... G01M 23/00
[52] U.S. Cl. .................................... 250/311; 250/306
[58] Field of Search .......................................... 250/311

[56] References Cited

U.S. PATENT DOCUMENTS

| | | | |
|---|---|---|---|
| 2,401,315 | 6/1946 | Ramberg | 250/311 |
| 2,547,994 | 4/1951 | Bertein | 250/311 |
| 2,580,675 | 1/1952 | Grivet et al. | 250/311 |
| 2,688,091 | 8/1954 | Tadano et al. | 250/311 |
| 3,504,176 | 3/1970 | Thon | 250/311 |

Primary Examiner—Harold A. Dixon
Attorney, Agent, or Firm—Kenyon & Kenyon, Reilly, Carr & Chapin

[57] ABSTRACT

A corpuscular-beam transmission-type microscope in which image elements are generated simultaneously. The microscope includes a specimen holding stage movable perpendicular to the microscope axis in a pair of transverse adjustment directions, beam deflectors disposed behind the specimen along the beam path for deflecting an image in the microscope in at least one deflection direction, and magnetic lens imaging means disposed between the specimen and the beam deflectors which helically deflects, between the specimen and the beam deflectors, parts of the beam not disposed in the microscope axis and rotates the image of the specimen through an image rotation angle in the microscope. The improvement of the invention comprises the beam deflectors deflecting the beam in a pair of transverse deflection directions disposed in a plane parallel to the pair of transverse adjustment directions and rotated with respect to the pair of transverse adjustment directions through an angle coinciding with the image rotation angle.

1 Claim, 2 Drawing Figures

CORPUSCULAR-BEAM TRANSMISSION-TYPE MICROSCOPE INCLUDING AN IMPROVED BEAM DEFLECTION SYSTEM

BACKGROUND OF THE INVENTION

1. Field of the Invention

This invention relates generally to corpuscular-beam, transmission-type microscopes, such as an electron microscope, in which image elements are generated simultaneously, and in particular to an improved beam deflection means for such microscopes disposed behind the specimen along the beam path in the microscope.

2. Description of the Prior Art

Corpuscular-beam, transmission-type microscopes in which image elements are generated simultaneously are known in the art. See, for example, Siemens publication Eg 1/204, "Semiconductor Detectors for the Measurement of Current Density in the Electron Microscope," Jan. 1969, and German Auslegeschrift No. 2,016,753. As described in the above publication and German Auslegeschrift, such microscopes form an image of a specimen by means of magnetic lenses. All magnetic lenses have the property that charged particles passing through such a lens outside the axis of symmetry are deflected helically about the axis while in the magnetic field. The image of the specimen is thereby rotated through an angle with respect to the specimen known as the image rotation angle, which angle is proportional to the integral of the field intensity of the magnetic fields through which the charged particle travels. This image rotation makes it difficult for the observer to orient the specimen and to finely adjust the specimen image.

SUMMARY OF THE INVENTION

It is therefore an object of the present invention to provide a corpuscular-beam transmission-type microscope including an improved beam deflection system which overcomes the aforementioned problems of orientation of the specimen and fine adjustment of the specimen image.

These and other objects of the invention are achieved in a corpuscular-beam transmission-type microscope in which image elements are generated simultaneously including means for holding a specimen movable perpendicular to the microscope axis in a pair of transverse adjustment directions. The microscope includes beam deflection means disposed behind the specimen along the beam path for deflecting an image of the specimen in the microscope in at least one deflection direction and magnetic lens imaging means disposed between the specimen and the beam deflection means which helically deflects, between the specimen and the beam deflection means, parts of the beam not disposed in the microscope axis and rotates the image of the specimen through an image rotation angle in the microscope. The improvement of the invention comprises the deflection means deflecting the beam in a pair of transverse deflection directions disposed in a plane parallel to said pair of transverse adjustment directions and rotated with respect to the pair of transverse adjustment directions through an angle coinciding with the image rotation angle.

The advantage of the invention is that the specimen image, which may be generated, for example, on a fluorescent screen, travels in the same direction on the screen whenever the specimen holding means is moved in one of the transverse adjustment directions or the beam is deflected in the corresponding transverse deflection direction. This substantially simplifies the observer's problem of orienting the specimen and finely adjusting the specimen image.

These and other features of the invention will be described in greater detail in the following detailed description.

DETAILED DESCRIPTION

Figure 1:
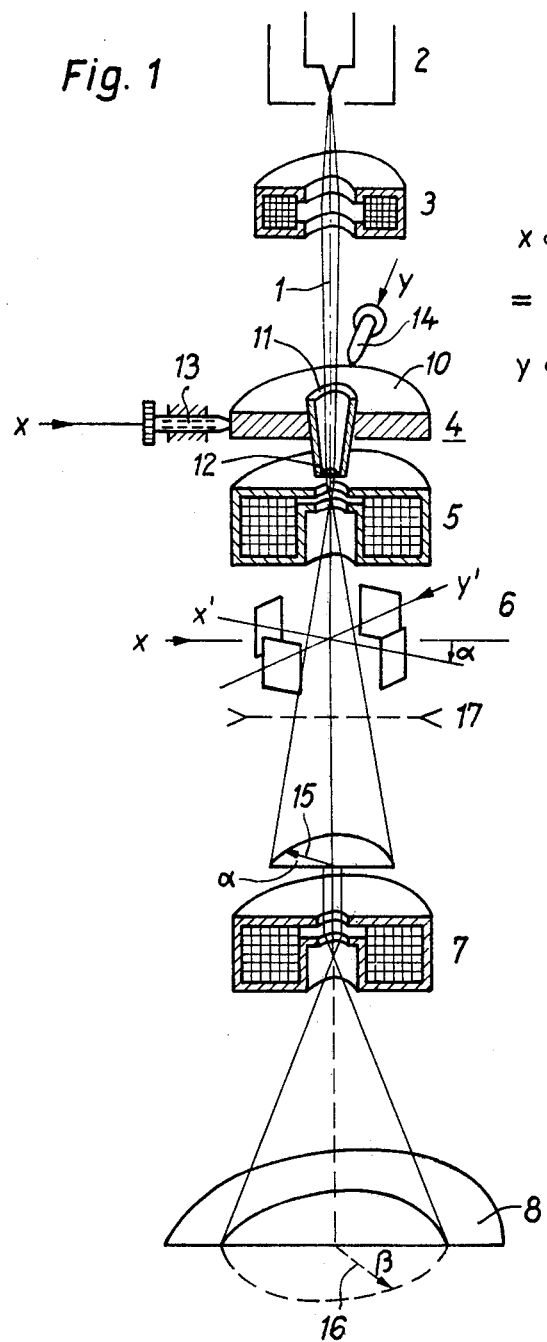
FIG. 1 is a schematic illustration of a corpuscular beam transmission-type microscope including an improved beam deflection means constructed according to the invention.

Referring now to the drawings, and in particular to FIG. 1, there is shown, in schematic form, an electron-beam transmission-type microscope in which image elements are generated simultaneously. The microscope comprises an electron beam source 2, a condenser lens 3, a specimen stage 4, a magnetic objective lens 5, a deflection system 6, a projection lens 7 and a fluorescent screen 8. The axis of the microscope is identified by the reference numeral 1.

The specimen stage 4 includes a table 10 which holds a specimen cartridge 11. The specimen 12 is at the lower end of specimen cartridge 11 and table 10 is movable transversely in two orthogonal adjustment directions with respect to axis 1. More specifically, table 10 is movable in the $x$-direction by a plunger 13 and in the $y$-direction by a plunger 14.

A line segment extending over specimen 12 in the $x$-direction in the plane of the drawing is imaged by objective lens 5 as a first real image, which is symbolized by the arrow 15. This intermediate first real image is magnified again by the projection lens 7 and is imaged as a real image, which is symbolized by the arrow 16, on fluorescent screen 8.

In the embodiment of the invention illustrated in FIG. 1, the image rotation angle caused by objective lens 5 is identified by the reference character $\alpha$. Accordingly, first real image 15 is rotated out of the plane of the drawing by the angle $\alpha$. If the specimen is now moved in the $x$-direction by operation of plunger 13, then first real image 15 will be displaced in the direction defined by the angle $\alpha$ and through the angle $\alpha$ with respect to the plane of the drawing.

It is the primary purpose of deflection system 6 to facilitate a fine electrical readjustment of the image which supplements the mechanical adjustment system of specimen stage 4. In the illustrated embodiment of the invention, deflection system 6 comprises two pairs of electrostatic plates, arranged at right angles with respect to each other, which deflect the microscope beam in a pair of transverse deflection directions $x'$ and $y'$ which are disposed in a plane parallel to adjustment directions $x$ and $y$ of specimen stage 4. The control signals used to control the deflection plates comprise voltage signals. Pairs of magnetic coils controlled by current signals may, however, also be used to operate the deflection system. The beam deflection directions $x'$ and $y'$ of deflection system 6 are also rotated through image rotation angle $\alpha$ in a plane perpendicular to axis 1 with respect to adjustment directions $x$ and $y$ of specimen stage 4.

Excitation of deflection system 6 in deflection direction $x'$, thus, causes a displacement of first real image 15 in the image rotation angle direction. The same displacement is caused by movement of specimen stage 4 in the direction $x$. The observer of the image projected on fluorescent screen 8 can, thus, mechanically adjust the specimen stage 4 in the $x$-direction and, alternatingly, electrically adjust the beam deflection in the corresponding deflection direction $x'$ with the same effects, which greatly facilitates the adjustment of the image and the location of details on the specimen. Of course, the same effects are achieved by displacing stage 4 and the beam in adjustment direction $y$ and deflection direction $y'$.

A further rotation of the specimen image through a further image rotation angle $\beta$ is caused by projection lens 7 but is of no significance for the present problem since its effect is the same whether the displacement of first real image 15 is caused by movement of the specimen stage 4 or by means of deflection system 6.

The rotation of image 15 is controlled by the lens fields between specimen 12 and the center plane of deflection system 6. In the embodiment of the invention illustrated, this is the entire field of objective lens 5, since specimen 12 is located above this lens. The specimen can, however, be located within the objective lens field, e.g., in so-called single field condenser lenses. In the latter case, only that part of the objective lens field which is below the specimen is considered in determining the magnitude of the angle $\alpha$.

The electron microscope may include a so-called intermediate lens 17 which is schematically illustrated in FIG. 1. Intermediate lens 17 images the lower focal plane of objective lens 5 in the object plane of projection lens 7 if refraction pictures are taken. The Siemens publication previously referred to herein states that the beam deflection system can be disposed within the intermediate lens. In this type of arrangement, that part of the field of the intermediate lens 17 which lies above the center plane of deflection system 6 is also considered in determining the magnitude of the angle $\alpha$.

In the illustrated embodiment of the invention, deflection system 6 is shown, for the purpose of clarity, with the deflection plates rotated with respect to adjustment directions $x$ and $y$ and disposed in the beam deflection directions $x'$ and $y'$. The angle $\alpha$, however, depends on the magnitude of the excitation of objective lens 5. This can be taken into account by rotatably mounting deflection system 6 about axis 1 and by providing a drive mechanism extending into the microscope from outside thereof.

Figure 2:
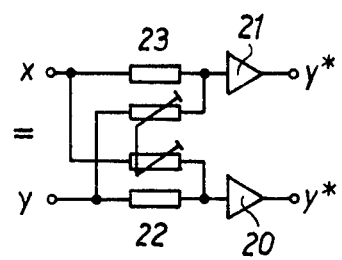
FIG. 2 is a schematic electrical diagram of a circuit for matching the transverse deflection directions of the beam deflection means to the excitation of the objective lens in a microscope constructed according to the invention.

The deflection directions $x'$ and $y'$ can also be matched to the excitation of the objective lens by electrical means. A circuit for this purpose is shown in FIG. 2. D-C voltage signals are applied to input terminals $x$ and $y$ as control variables and D-C voltage output signals at the terminals $x^*$ and $y^*$ are used to excite the plates of deflection system 6. Operational amplifiers 20 and 21, the input terminals of which are coupled to each other by potentiometers 22 and 23, respectively, amplify the input signals at terminals $x$ and $y$ and generate the output signals at terminals $x^*$ and $y^*$. The output voltage signals at terminals $x^*$ and $y^*$ have angular relationships with respect to the input voltages at terminals $x$ and $y$ depending upon the setting of the potentiometers. For smaller adjustment angles (up to about 5°), linear potentiometers are sufficient; for larger angles, sine and cosine potentiometers are necessary.

It is also possible to couple the adjustment terminals of potentiometers 22 and 23 to the current supply of objective lens 5 so that the angle $\alpha$ is automatically matched to the image rotation caused by the lens field when the excitation or the polarity of the objective lens is varied.

In addition to the static displacement of the image projected on fluorescent screen 8, and in accordance with a method described in the Siemens publication previously referred to, deflection system 6 can be used to measure the current density distribution of the image by moving the image in raster-fashion over a detector arranged in the plane of fluorescent screen 8.

The present invention has been described with specific reference to an electron beam transmission microscope. It should be noted however, that the invention is also applicable to corpuscular-beam transmission-type microscopes of other kinds, e.g., ion microscopes.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a corpuscular-beam transmission-type microscope in which image elements are generated simultaneously including means for holding a specimen movable perpendicular to the microscope axis in a pair of transverse adjustment directions, beam deflection means disposed behind the specimen along the beam path for deflecting an image of the specimen in the microscope in at least one deflection direction, and magnetic lens imaging means disposed between the specimen and the beam deflection means which helically deflects, between the specimen and the beam deflection means, parts of the beam not disposed in the microscope axis and rotates the image of the specimen through an image rotation angle in the microscope, the improvement comprising said beam deflection means deflecting said beam in a pair of transverse deflection directions disposed in a plane parallel to said pair of transverse adjustment directions and rotated with respect to said pair of transverse adjustment directions through an angle coinciding with said image rotation angle.

* * * * *